United States Patent [19]
Kaneda

[11] 4,373,209
[45] Feb. 8, 1983

[54] METHOD AND CIRCUITRY FOR CONTROLLING THE INTERMEDIATE FREQUENCY OF AN FM RECEIVER TO LESSEN PHASE DISTORTION

[75] Inventor: Ryoichi Kaneda, Tokyo, Japan
[73] Assignee: Trio Kabushiki Kaisha, Tokyo, Japan
[21] Appl. No.: 234,960
[22] Filed: Feb. 17, 1981
[30] Foreign Application Priority Data
  Mar. 10, 1980 [JP]    Japan .................................. 55-29878
[51] Int. Cl.³ ............................................ H04B 1/26
[52] U.S. Cl. ................................... 455/208; 455/295; 455/311
[58] Field of Search ............... 455/205, 208, 296, 303, 455/304, 305, 306, 311, 258, 295

[56] References Cited
U.S. PATENT DOCUMENTS
4,237,556 12/1980 Naito .................................... 455/208

*Primary Examiner*—Marc E. Bookbinder
*Attorney, Agent, or Firm*—Gerald J. Ferguson, Jr.; Joseph J. Baker

[57] ABSTRACT

Circuitry for controlling the intermediate frequency of an FM receiver comprising modulating means for frequency modulating the intermediate frequency signal with a modulating signal of predetermined frequency; detecting means for detecting the absolute amount of distortion incurred by the modulating signal of predetermined frequency at the intermediate frequency amplification stage of the FM receiver; and control means for changing the intermediate frequency by incremental amounts to control the intermediate frequency so that the distortion at the intermediate frequency amplification stage is minimized in accordance with the increase or decrease in the distortion detected by the detecting means.

8 Claims, 6 Drawing Figures

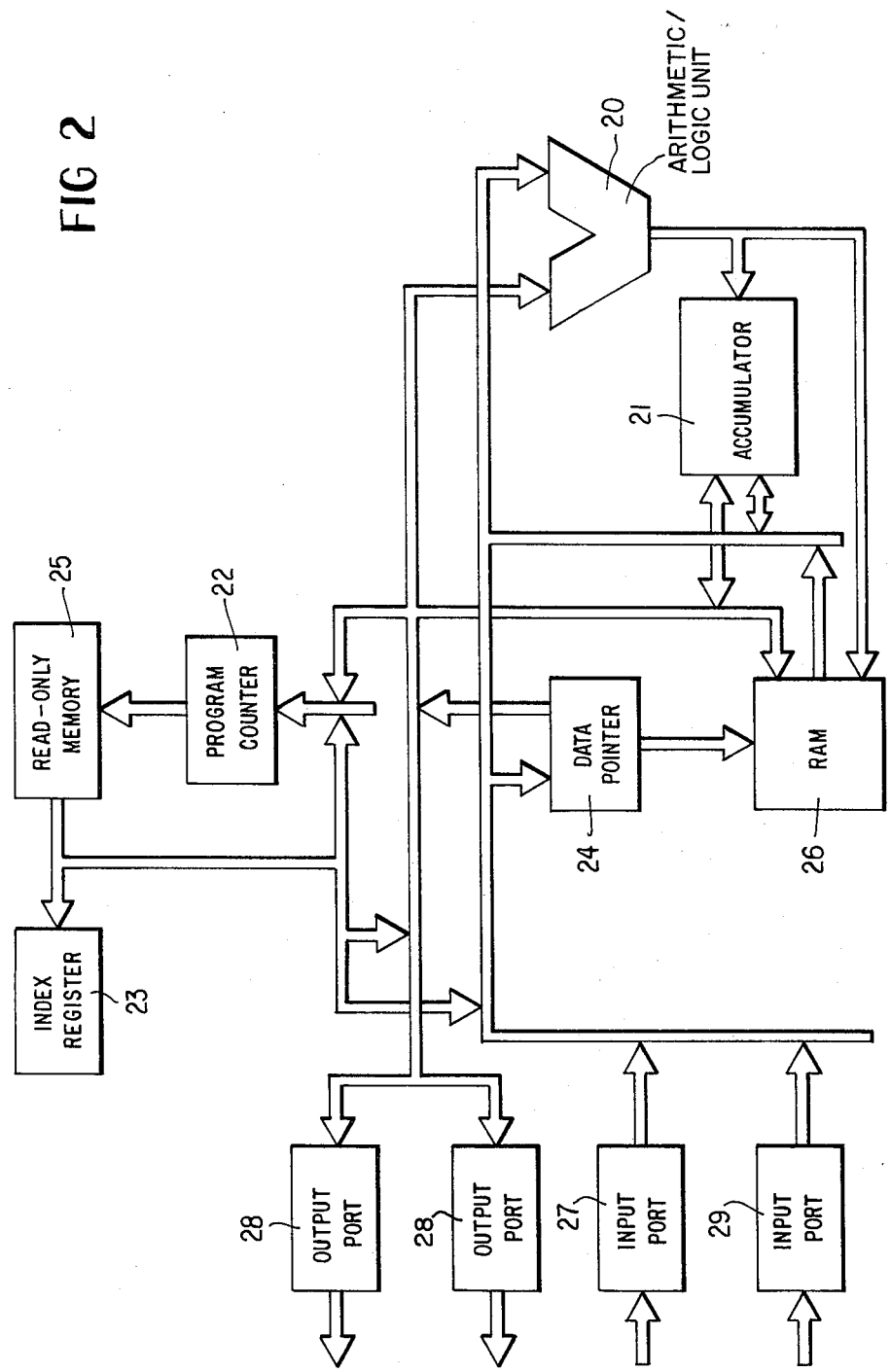

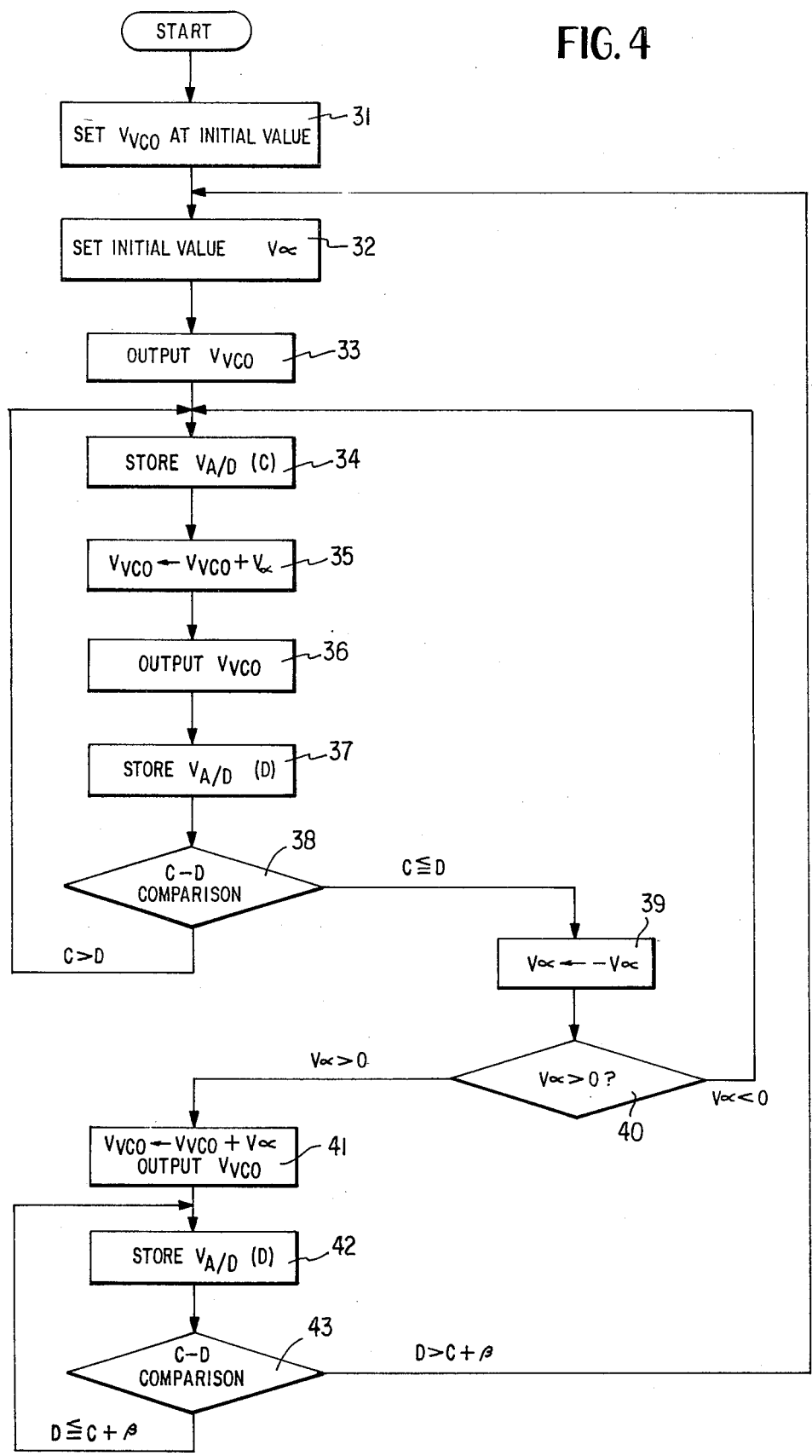

FIG. 5
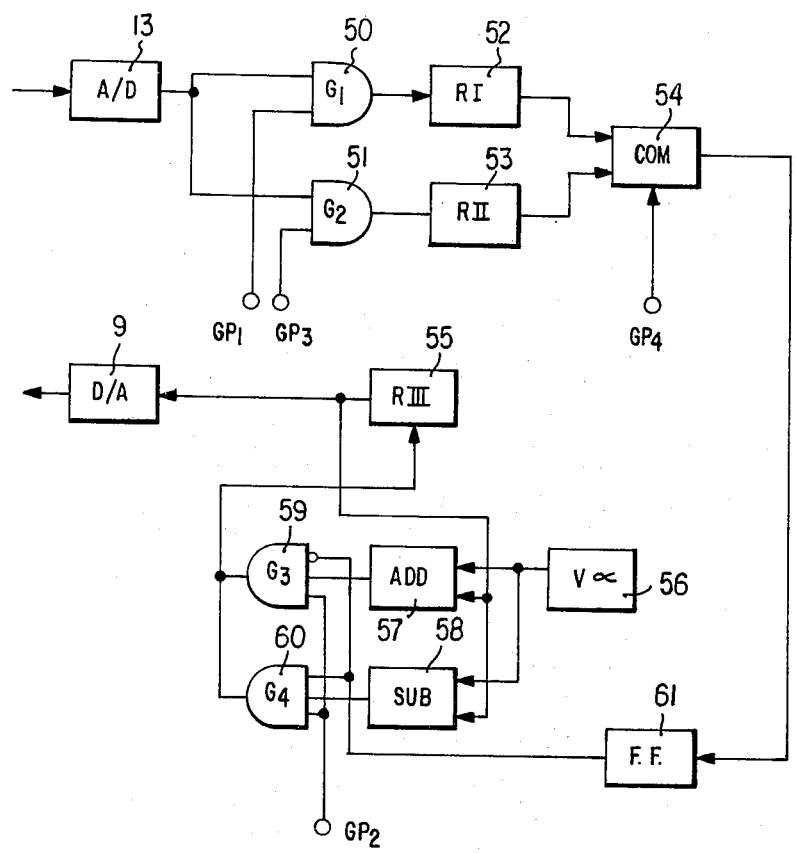
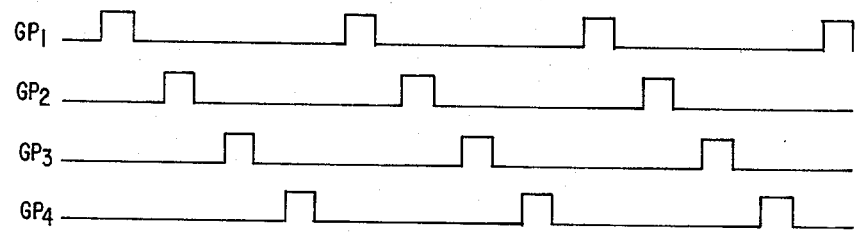
FIG. 6

METHOD AND CIRCUITRY FOR CONTROLLING THE INTERMEDIATE FREQUENCY OF AN FM RECEIVER TO LESSEN PHASE DISTORTION

BACKGROUND OF THE INVENTION

This invention relates to a method and circuitry for controlling the intermediate frequency of an FM receiver such that the phase distortion of the FM receiver in the intermediate frequency amplification stage is minimized during broadcast reception.

Distortion caused by band-pass filters in the intermediate frequency amplification stage comprises the majority of FM receiver distortions. The distortion caused by band-pass filters is highly frequency-dependent and increases suddenly as the intermediate frequency deviates from the optimal value. Therefore, a method has been proposed in U.S. Pat. No. 4,237,556 to solve this problem by modulating the intermediate frequency signals at a specific frequency, detecting the even number distortions from the detection output, and controlling the intermediate frequency by using the phase so that the specific component in the distortion becomes zero, thus resulting in almost minimum distortion at the intermediate frequency amplification stage.

However, when the above-mentioned method is used, aside from the shortcoming that the complex construction may be costly, there appears to be another shortcoming in that the distortion is not always controlled at the minimum point due to the focusing on a specific component alone in the distortion.

SUMMARY OF THE INVENTION

The present invention was made in view of the above-mentioned problems and an object is to provide a method and circuitry for controlling the intermediate frequency of an FM receiver without the above-mentioned shortcomings.

The method and circuitry of this invention is characterized in that a first means FM-modulates the intermediate frequency signals of an FM receiver at a specific frequency, and a second means detects the absolute amount of distortion of the specific frequency incurred at the intermediate frequency amplification stage from the output of the intermediate frequency signals which are modulated at the said specific frequency and demodulated by the demodulator circuit of the FM receiver. Incremental, minute changes of the intermediate frequency are effected to control the intermediate frequency. Thus, distortion at the intermediate frequency amplification stage is minimized in accordance with the increase or decrease of the distortion detected by the second means.

Other objects and advantages of this invention will be apparent from a reading of the following specification and claims taken with the drawing.

BRIEF DESCRIPTION OF THE DRAWING

FIG. 2 is a block diagram of an illustrative embodiment of a control circuit for use in FIG. 1.

FIGS. 3 and 4 are diagrams which illustrate the operation of the invention.

FIG. 5 is a block diagram of another illustrative embodiment of the control circuit of FIG. 1.

FIG. 6 is a timing diagram illustrating the operation of the control circuit in FIG. 5.

DETAILED DESCRIPTION OF PREFERRED EMBODIMENT

Figure 1:
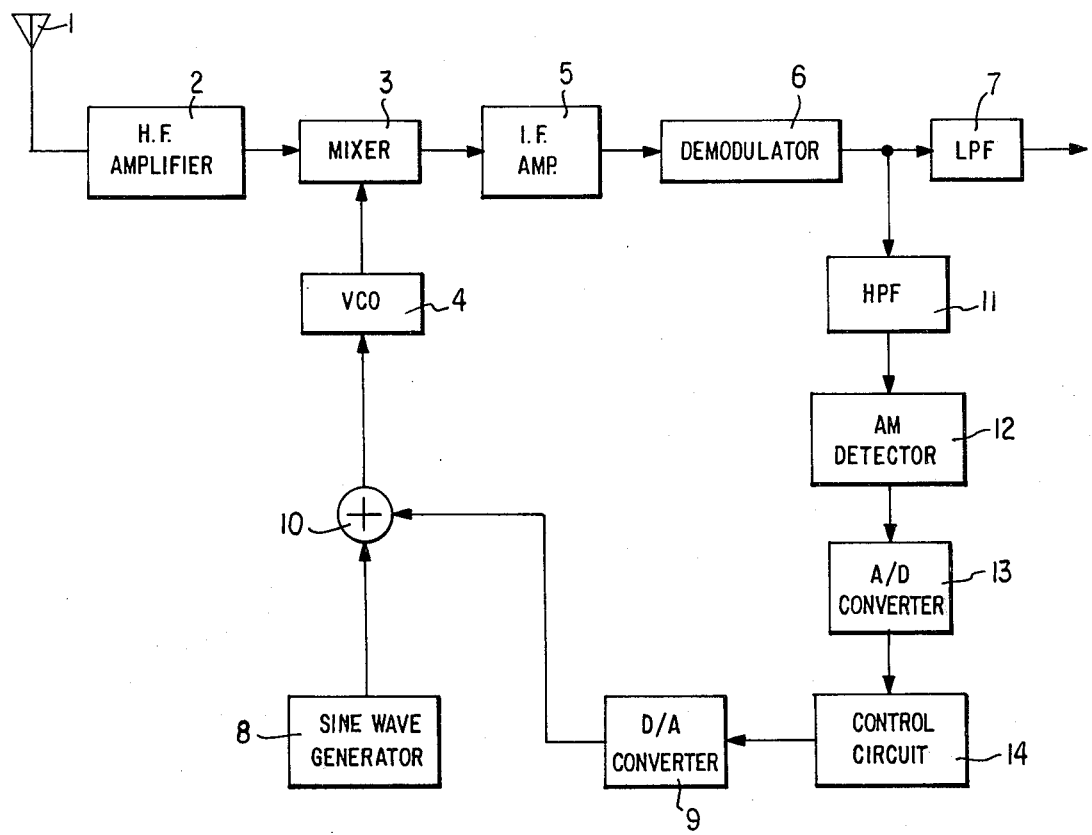
FIG. 1 is a block diagram of an illustrative embodiment in accordance with the invention.

Reference should be made to the drawing where like reference numerals refer to like parts.

Referring to FIG. 1, 1 is an antenna, 2 is a high frequency amplification stage, 3 is a mixing circuit, 4 is a local oscillator comprised of a voltage controlled oscillator that can cause minute changes in the oscillation frequency by impressing a control voltage (VCO hereafter), 5 is an intermediate frequency amplification stage, 6 is a demodulator circuit, 7 is a low-pass filter, and the output of the low-pass filter 7 is applied to a low frequency amplification stage (not shown) where the foregoing elements comprise an ordinary FM receiver.

8 is a sine wave generator, the oscillation frequency of which is set sufficiently high compared to the frequency of the demodulation component of the broadcast signals, and the waveform of which is a sine wave with little distortion. DC output from a D/A converter 9 and the voltage of sine wave oscillator 8 are added at an adder 10 and the signal is impressed on VCO 4 where the oscillation frequency of VCO 4 is determined by the output voltage of adder 10. Thus, the oscillation frequency of VCO 4 is FM-modulated at the oscillation frequency of sine wave oscillator 8 and the central frequency is determined by the output voltage of D/A converter 9.

The broadcast signal inputted from antenna 1 is amplified at high frequency amplification stage 2 and mixed with the output of VCO 4 to produce the intermediate frequency signals. Thus, since the output of VCO 4 is FM-modulated at the oscillation frequency of sine wave oscillator 8, the intermediate frequency signals are FM-modulated by both the FM-modulated portion of the broadcast signals and the FM-modulated portion of VCO 4. Accordingly, the demodulated output of demodulator 6 contains the signal component of sine wave oscillator 8 in addition to the demodulated component of the broadcast signals. Since the oscillation frequency of sine wave oscillator 8 is set sufficiently high compared to the demodulated component of the broadcast signals, it is removed by low-pass filter 7 so that the output signal of sine wave oscillator 8 does not influence the low frequency amplification stage.

11 is a high-pass filter which derives a frequency component of more than twice the oscillation frequency of sine wave oscillator 8, 12 is an AM detection circuit, 13 is an A/D converter, and 14 is a control circuit. The output of demodulator 6 is passed by high-pass filter 11 so that a frequency component of more than double the oscillation frequency of sine wave oscillator 8 is derived. Since the distortion factor of sine wave oscillator 8 is set sufficiently small, the output of high-pass filter 11 is almost proportional to the distortion factor of intermediate frequency amplification stage 5. The output of high-pass filter 11 is detected by AM detection circuit 12 and converted to a DC voltage, this DC voltage being converted to a digital signal by A/D converter 13. Consequently, the output of A/D converter 13 is proportional to the distortion factor of intermediate frequency amplification stage 5.

As shown in FIG. 2, control circuit 14 is comprised, for example, of a microprocessor that consists of an arithmetic/logic unit 20, accumulator 21, program counter 22, index register 23, data pointer 24, and a microcomputer that includes a read-only memory 25, read/write memory 26, input port 27 where the output of A/D converter 13 is inputted, output port 28 from where the output is inputted to D/A converter 9, and input port 29.

The read-only memory 25 stores the program for control circuit 14. Generally speaking, the program gradually adds minute voltage changes, $V_\alpha$, to the initial voltage for VCO 4, $V_{VCO}$, whereby the oscillation frequency of VCO 4 is gradually or incrementally changed in correspondence to the voltage, $V_\alpha$. The respective outputs of A/D converter 13 are stored before and after voltage $V_\alpha$ is changed at allocated addresses in read/write memory 26. They are then compared to determine the increase or decrease in distortion. Control of the intermediate frequency to minimize the distortion at intermediate frequency amplification stage 5 is then effected depending on the results of the comparison.

Figure 3:
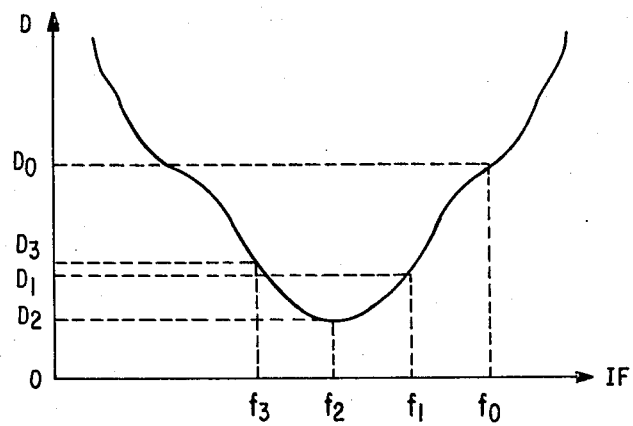

A specific explanation is given with respect to FIGS. 3 and 4 where FIG. 3 illustrates a characteristic diagram of distortion D of the intermediate frequency IF in the intermediate frequency amplification stage and FIG. 4 is a flow chart of the operation of control circuit 14.

First of all, the control circuit effects initial settings, namely, the initial setting of the voltage for local oscillator 4, $V_{VCO}$, (the initial voltage is noted as $V_0$) and the initial setting of the minute voltage increments of $V_{VCO}$, $V_{60}$, ($V_\alpha$ is set as a positive value). $V_{VCO}$ and $V_\alpha$ are stored at allocated addresses (noted as address A and address B hereafter) of read/write memory (noted as RAM hereafter) 26 respectively. This is the state shown in FIG. 4 at 31 and 32. Then, the content of address A ($V_0$) is outputted to D/A converter 9 via output port 28. The intermediate frequency at this time is set as $f_0$. A pulse indicating completion of the tuning operation is inputted through input port 29. Corresponding to the intermediate frequency $f_0$, a voltage (FIG. 3) proportional to the distortion of intermediate frequency stage 5 at the intermediate frequency $f_0$, $D_0$, is outputted at A/D converter 13 as discussed above with respect to sine wave oscillator 8, high pass filter 11, AM detection circuit 12, and A/D converter 13. This voltage $D_0$ is read through input port 27 and stored at address C of RAM 26. Then, voltages $V_0$ and $V_\alpha$ are added and stored at address A in RAM 26. Next, the contents of address A, that is ($V_0 + V_\alpha$) are outputted at D/A converter 9.

This state is shown in FIG. 4 at 34, 35 and 36. Thus, the oscillation frequency of VCO 4 is changed in accordance with voltage $V_\alpha$, and the intermediate frequency changes to $f_1$. Distortion at intermediate frequency stage 5 that corresponds to intermediate frequency $f_1$ (FIG. 3) appears as output of A/D converter 13, $D_1$, which is read in and stored at address D in RAM 26. Then, the contents of addresses C and D, $D_0$ and $D_1$, are compared. The state thus far is shown in FIG. 4 at 37 and 38.

As seen in FIG. 3, $D_0 > D_1$ at intermediate frequency stage 5 of this example, that is, $C > D$. The $D_1$ output of A/D converter is then stored in address C. This is followed by addition of the contents of address A ($V_0 + V_\alpha$) and the contents of address B, $V_\alpha$, which are stored in address A.

Next, the new contents of address A ($V_0 + 2V_\alpha$) are outputted through D/A converter 9. Thus, the intermediate frequency changes corresponding to voltage $V_\alpha$, and the intermediate frequency becomes $f_2$. The output of A/D converter 13 becomes $D_2$ due to the distortion of intermediate frequency amplification stage 5 caused by intermediate frequency $f_2$. $D_2$ is stored at address D. The contents of addresses C and D, $D_1$ and $D_2$, are then compared. As is clear from FIG. 3, $D_1 > D_2$. $D_2$, is thus transferred to address C.

Next, ($V_0 + 3V_\alpha$) is outputted at D/A converter 9 as the above cycle is repeated and intermediate frequency $f_3$ results. The output of A/D converter 13 at this time, $D_3$, is stored at address D. The contents of addresses C and D, $D_2$ and $D_3$, are compared. As is clear from FIG. 3, $D_3 > D_2$—that is, $C < D$. The comparison thus results in a sign reversal with respect to the previous case of $f_1$ and $f_2$ so the sign of the contents of address B, $V_\alpha$, is reversed—that is, $V_\alpha$ becomes a negative value ($-V_\alpha$). The contents of address B, ($-V_\alpha$) are next checked for positive or negative sign. In this case, it is negative. This state is shown in FIG. 4 at 39 and 40. $D_3$, the output of A/D 13, is now moved to address C. Next, the contents of address A, ($V_0 + 3V_\alpha$) and the contents of address B, ($-V_\alpha$) are added and stored in address A.

The new contents of address A, ($V_0 + 2V_\alpha$), are then outputted through D/A converter 9. The intermediate frequency becomes $f_2$. The output of A/D converter 13 at this time, $D_2$, is stored at address D, and the contents of addresses C and D, $D_3$ and $D_2$, are compared. In this case, $D_3 > D_2$, (that is $C > D$). Thus, $D_2$ is moved to address C. Further, the contents of address B, ($-V_\alpha$), remains as is and added to the contents of address A, ($V_0 + 2V_\alpha$). The contents of address A, ($V_0 + V_\alpha$), are outputted through D/A converter 9 and the intermediate frequency becomes $f_1$. The output of A/D converter 13 corresponding to intermediate frequency $f_1$, $D_1$, is stored at address D. The contents of addresses C and D, $D_2$ and $D_1$ are compared. In this case $D_1 > D_2$ ($C < D$) and the sign reverses as a result of the comparison. Therefore, as in the cases of intermediate frequencies, $f_2$ and $f_3$, mentioned above, the circuit operation enters into 39 and 40 of FIG. 4 where the sign of the address B contents, ($-V_\alpha$) is reversed making the address B contents ($V_\alpha$). Next, the sign of address B contents, ($V_\alpha$), is checked. In this case, since the sign is ($+$), the operation steps to 41 of FIG. 4 where the contents of address B, ($V_\alpha$), are added to the contents of address A, ($V_0 + V_\alpha$) and stored at address A. Then, the new contents of address A, ($V_0 + 2V_\alpha$), are outputted through D/A converter 9. The intermediate frequency signals then become $f_2$, and the output of A/D converter 13, $D_2$, is stored at address D. Next, the contents of addresses C and D, $D_2$ and $D_2$, are compared. At this point, the contents of addresses C and D are equal so that the program enters the loop of 42 through 43 in FIG. 4 where the contents of addresses C and D, $D_2$, are repeatedly compared. As long as the output of A/D converter 13 is $D_2$, the voltage for controlling VCO 4, ($V_0 + 2V_\alpha$), does not change; it is maintained at the state of minimum distortion.

In this state, if the characteristic of intermediate frequency amplification stage 5 or VCO 4 changes due to, for example, changes in environment, the output of A/D converter 13 becomes larger than $D_2$. When the increase is greater than a specified value (tolerance for distortion deterioration is noted as $\beta$), the circuit operation returns to 32 from 43 in FIG. 4 to repeat the above steps to again control the intermediate frequency at minimum distortion. The reason for setting the tolerance for distortion deterioration, $\beta$, is to prevent erroneous operation caused by minute fluctuations in output of the A/D converter due to noise, etc.

In the above example, the intermediate frequency where distortion is minimized is frequency $f_2$ as shown in FIG. 3. The same is true when the intermediate frequency where distortion is minimized is between intermediate frequencies $f_2$ or $f_3$ since the $V_\alpha$ stored in address B is selected to be small. The foregoing is also true when the intermediate frequency where distortion is minimized is between intermediate frequencies $f_1$ and $f_2$ in FIG. 3.

When the outputs of A/D converter 13 at intermediate frequencies $f_2$ and $f_3$ in FIG. 3, are equal, $D_2=D_3$ is determined at 38 in FIG. 4 so that the circuit operation proceeds to 39. Then, passing through intermediate frequencies $f_3$, $f_2$, $f_1$, and $f_2$, the sign (+) of the contents of address B ($+V_\alpha$) at 40 in FIG. 4 is detected, and the intermediate frequency is maintained at $f_2$.

Another example of control circuit 14 is shown in FIG. 5 where 50, 51, 59, and 60 are gates, and their make and break are controlled by control signals $GP_1$, $GP_2$, and $GP_3$. 52, 53, and 55 are registers. 54 is a digital comparator (simply noted comparator hereafter), and it compares two inputs using control signal, $GP_4$. 56 is a setter where the voltage $V_\alpha$ is set. 57 is a digital adder (simply noted as adder hereafter) that adds values of $V_\alpha$ and register 55. 58 is a digital subtracter (simply noted as subtracter hereafter) that subtracts $V_\alpha$ from the value of register 55. 61 is a flip-flop that reverses at the fall of the output of comparator 54.

At the initial time of operation, it is assumed that register 55 is set at the initial setting voltage, $V_0$, and the flip-flop 61 is set at 0.

When the tuning operation is completed in this state, the circuit operates according to the gate control pulse in FIG. 6. First, gate 50 is opened by $GP_1$ pulse, and the output of A/D converter 13 that corresponds to intermediate frequency $f_0$ at this time, $D_0$, is stored in register 52. Next, gate 59 is opened by the $GP_2$ pulse, $(V_0+V_\alpha)$ is stored in register 55, and the intermediate frequency changes to $f_1$. Gate 51 is then opened by the $GP_3$ pulse, and $D_1$ is stored in register 53. Next, using the $GP_4$ pulse, comparator 54 compares the contents of register 52, $D_0$, to the contents of register 53, $D_1$. Here, since register 52 > register 53, the output of comparator 54 becomes 1, and the output of flip-flop 61 remains 0 without change.

$D_1$ is then stored at register 52 by the $GP_1$ pulse, the contents of register 55 results in $(V_0+2V_\alpha)$, and the intermediate frequency becomes $f_2$ caused by the $GP_2$ pulse, $D_2$ is stored in register 53 by the $GP_3$ pulse, and register 52 and register 53 are compared by the $GP_4$ pulse. Since register 52 > register 53 again, the output of flip-flop 61 remains 0. Then, as before, $D_2$ is stored in register 52, the intermediate frequency changes to $f_3$, and $D_3$ is stored in register 53. This time, since register 52 < register 53, the output of comparator 54 changes from 1 to 0, and the output of flip-flop 61 changes to 1.

Therefore, since gate 60 opens in the next cycle due to the $GP_2$ pulse, $D_3$ is stored in register 52, the intermediate frequency becomes $f_2$, and $D_2$ is stored in register 53. Now that register 52 > register 53, flip-flop 61 remains 1.

By repeating the operation described above, the intermediate frequency shuttles between $f_1$, $f_2$, and $f_3$, and by selecting $V_\alpha$ small, the intermediate frequency can be controlled in the prescribed range (determined by $V_\alpha$) from the intermediate frequency for minimum distortion.

As explained above, when this invention is used, the distortion in the intermediate frequency amplification stage can be minimized in FM receivers. And, a circuit in which this invention is applied results in a simplified construction.

It is to be understood that the above detailed description of the various embodiments of the invention is provided by way of example only. Various details of design and construction may be modified without departing from the true spirit and scope of the invention as set forth in the appended claims.

What is claimed is:

1. Circuitry for controlling the intermediate frequency signal occurring at an intermediate frequency amplification stage of an FM receiver having FM signals applied thereto comprising modulating means for frequency modulating the intermediate frequency signal with a modulating signal of predetermined frequency where said modulating means includes a voltage controlled oscillator, the output of which is mixed with the FM signals applied to the receiver and a sine wave generator, the output of which FM modulates the voltage controlled oscillator;

detecting means for detecting the absolute amount of distortion incurred by said modulating signal of predetermined frequency at the intermediate frequency amplification stage of the FM receiver; and control means for changing the intermediate frequency by incremental amounts to control the intermediate frequency so that the distortion at the intermediate frequency amplification stage is minimized in accordance with any increase or decrease in the distortion detected by said detecting means where said control means includes means for generating a DC signal which is added to the output of the sine wave generator where the DC signal determines the central frequency of the voltage controlled oscillator; means for establishing an initial value of said DC voltage and the value of an incremental voltage; means for successively adding or subtracting said incremental voltage from the initial DC voltage to obtain an incremented DC voltage; comparison means for comparing the incremented DC voltage before and after each increment thereof; and means responsive to the comparison means for continuing the incrementing of the DC voltage until the distortion at the intermediate frequency amplification stage is minimized.

2. Circuitry as in claim 1 where said modulating signal of predetermined frequency is a sine wave.

3. Circuitry as in claim 1 or 2 where said FM receiver includes a demodulator for demodulating the intermediate frequency signal and a low pass filter responsive to the demodulator for passing broadcast signals where said predetermined frequency of the modulating signal is greater than those of the broadcast signals and is removed by the low pass filter.

4. Circuitry as in claim 3 where said detecting means includes a high pass filter responsive to the demodulator for passing a signal having a frequency more than twice said predetermined frequency of the modulating signal.

5. Method of controlling the intermediate frequency signal occurring at an intermediate frequency amplification stage of an FM receiver having FM signals applied thereto comprising the steps of frequency modulating the intermediate frequency signal with a modulating signal of predetermined frequency where said modulating step is effected by a voltage controlled oscillator and where said method includes the steps of (a) mixing the output of the voltage controlled oscillator with the FM signals applied to the receiver and (b) generating a sine wave which FM modulates the voltage controlled oscillator;

detecting the absolute amount of distortion incurred by said modulating signal of predetermined frequency at the intermediate frequency amplification stage of the FM receiver; and controlling the frequency of the intermediate frequency signal by changing the frequency thereof by incremental amounts so that the distortion at the intermediate frequency amplification stage is minimized in accordance with any detected increase or decrease in the distortion where said controlling step includes generating a DC signal which is added to the output of the sine wave generator where the DC signal determines the central frequency of the voltage controlled oscillator; establishing an initial value of said DC voltage and the value of an incremental voltage; successively adding or subtracting said incremental voltage from the initial DC voltage to obtain an incremented DC voltage; comparing the incremented DC voltage before and after each increment thereof; and continuing the incrementing of the DC voltage until the distortion at the intermediate frequency amplification stage is minimized.

6. A method as in claim 5 where said modulating signal of predetermined frequency is a sine wave.

7. A method as in claim 5 or 6 including the steps of demodulating the intermediate frequency signal and passing broadcast signals included in the demodulated signals, said predetermined frequency of the modulating signal being greater than those of the broadcast signals and being removed from the broadcast signals.

8. A method as in claim 7 where said detecting step includes passing a signal having a frequency more than twice said predetermined frequency of the modulating signal.

* * * * *